United States Patent [19]

Haraguchi

[11] Patent Number: 5,553,025
[45] Date of Patent: Sep. 3, 1996

[54] SEMICONDUCTOR MEMORY DEVICE EXECUTING A MEMORY TEST IN A PLURALITY OF TEST MODES

[75] Inventor: Yoshinori Haraguchi, Tokyo, Japan

[73] Assignee: NEC Corporation, Tokyo, Japan

[21] Appl. No.: 308,927

[22] Filed: Sep. 20, 1994

[30]    Foreign Application Priority Data

Sep. 27, 1993   [JP]   Japan .................................... 5-239709

[51] Int. Cl.$^6$ .................................................... G11C 7/00
[52] U.S. Cl. ................ 365/201; 365/189.03; 365/230.06
[58] Field of Search ............................... 365/201, 189.03, 365/191, 230.06; 371/21.1, 15.1

[56]    References Cited

U.S. PATENT DOCUMENTS

| | | | |
|---|---|---|---|
| 4,603,405 | 7/1986 | Michael | 365/201 |
| 5,134,587 | 7/1992 | Steele | 365/201 |
| 5,177,745 | 1/1993 | Rozman | 365/201 |
| 5,315,554 | 5/1994 | Nanba | 365/201 |

*Primary Examiner*—David C. Nelms
*Assistant Examiner*—Vu A. Le
*Attorney, Agent, or Firm*—Sughrue, Mion, Zinn, Macpeak & Seas

[57]    ABSTRACT

A semiconductor memory device comprises an address bus having plural bits for designating addresses included in a first address group assigned to a memory cell array and in a second address group assigned to plural test modes, a first address decoder for decoding addresses in the first address group, and a second address decoder for decoding addresses in the second address group. A test commanding section generates a test commanding signal responsive to any one of addresses assigned to plural test modes. The second decoder acting as a test mode selecting section is activated by the test commanding signal to generate a test mode selecting signal from addresses assigned to the test modes. A test performing section tests inside the memory device in one of the test modes based on the test mode selecting signal. Number of data items to be input for executing a test inside the memory device is reduced without increasing an external pins.

8 Claims, 4 Drawing Sheets

SEMICONDUCTOR MEMORY DEVICE EXECUTING A MEMORY TEST IN A PLURALITY OF TEST MODES

BACKGROUND OF THE INVENTION (a) Field of the Invention

The present invention relates to a semiconductor memory device and, more particularly, to a semiconductor memory device provided with a test performing section capable of executing memory tests in a plurality of test modes.

(b) Description of the Related Art

In semiconductor integrated circuit devices including semiconductor memory devices, a function test is executed in a plurality of test modes. The test modes include one executed when a memory device is finished to a product and another executed when the product is installed in service. Hence, when a memory device is to be tested, it is necessary to input to the memory device a test mode selecting signal for selecting one of predetermined test modes as well as a test commanding signal for switching the memory device to a test operation mode.

In general, switching a memory device from a normal operation mode to a test operation mode is effected by inputting a predetermined address assigned to a test operation mode of the memory device via an address bus, simultaneously with inputting a test mode selecting signal via one of external test mode pins each corresponding to one of several test modes. However, with an increasing higher integration and finer pattern of a memory device, it is requested that the number of external pins be decreased.

In some memory devices, selection of one of several test modes is effected by inputting data for designating the one of the test modes through data bus instead of providing a test mode selecting signal via a corresponding external pin. In this case, however, there is a drawback that the number of data items to be input for performing a test is large resulting in a complicated sequence of a memory tester for testing the memory device.

SUMMARY OF THE INVENTION

An object of the present invention is to provide a semiconductor memory device in which a reduced number of data items is required for performing a test and in which number of external pins is not increased for the test.

The present invention provides a semiconductor memory device comprising a substrate, a plurality of memory cells arrayed on the substrate and each having an address included in a first address group, an address bus composed of a plurality of bits for receiving an address signal designating one of addresses included in the first address group or one of addresses included in a second address group assigned to a plurality of test modes, a first address decoder operatively connected between the address bus and the memory cells for decoding addresses included in the first address group for the memory cells, a second address decoder, operatively connected to the address bus, for decoding addresses included in the second address group, and a test performing section, operatively connected to the second address decoder, for executing a memory test in one of the test modes based on the output of the second decoder.

In accordance with the semiconductor memory device according to the present invention, when an address included in the second address group and corresponding to one of test modes is input, one of the test modes corresponding to the input address is transmitted to the test performing section, which then executes a test for the memory device in accordance with the designated test mode. Since only address data are required for executing the test, the number of data items to be input can be reduced while the number of external pins is not increased.

The memory device according to the present invention is suitable for a video display unit. In typical memory devices used for image processing in a video display unit, the capacity of the memory device is generally determined based on the number of pixels of the display unit. Accordingly, the capacity of the memory device does not correspond to a power of 2, in contrast to an ordinary DRAM the capacity of which generally corresponds to a power of 2, e.g., 1 Mb or 4 Mb. On the other hand, most of such memory devices for image processing have a large number of address lines including word lines and data lines capable of designating addresses in number corresponding to a power of 2, in consideration of benefits in the circuit structure of the address decoder. In this case, there are many addresses which are not actually used in the memory cell array of the memory devices. The present invention can utilize the excess capacity of the address lines by providing a second decoder assigned to a plurality of test mode.

In the semiconductor memory device according to the present invention, both a signal for commanding execution of a test and a signal for selecting one of a plurality of test modes can be transmitted by inputting only a single address. Accordingly, a reduced number of data items need be input for executing a test without increasing the number of external pins, so that a test sequence can be simplified in a test for a memory device of a higher integration and a finer pattern.

BRIEF DESCRIPTION OF THE DRAWINGS

The above and further objects as well as features and advantages of the present invention will be more apparent from the following description, taken in conjunction with accompanying drawings in which.

DESCRIPTION OF THE PREFERRED EMBODIMENTS

Before describing embodiments of the present invention, a conventional semiconductor memory device will be described for the sake of understanding of the present invention.

Figure 1:
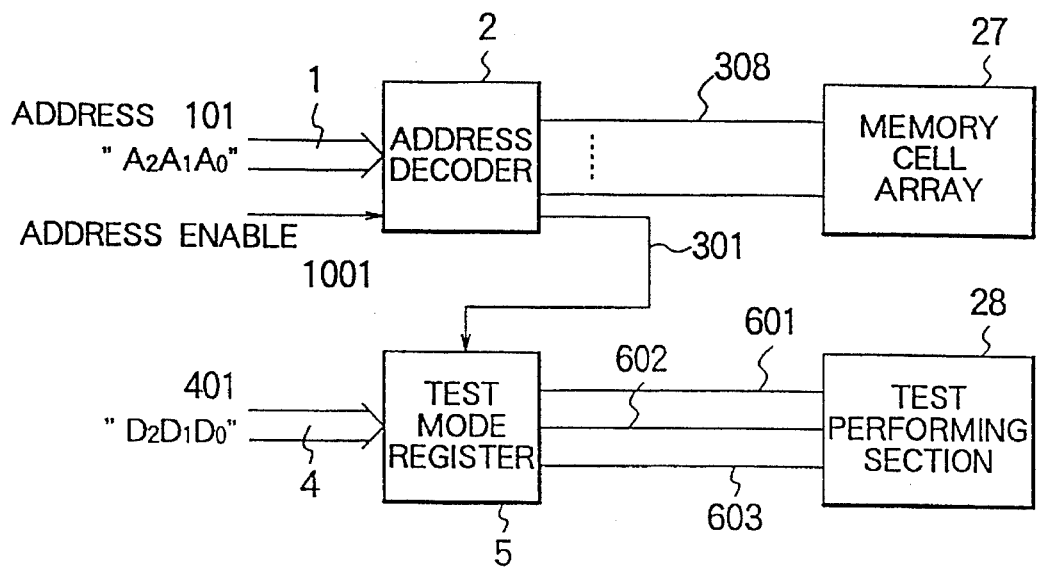
FIG. 1 is a block diagram of a conventional semiconductor memory device in a simplified model.

FIG. 1 shows a conventional semiconductor memory device in a simplified model utilizing data bus for inputting a test mode selecting signal. The memory device comprises an address bus 1, an address decoder 2, data bus 4, a test mode register 5, a memory cell array 27 and a test performing section 28. When the address decoder 2 receives an input address 101 composed of a plurality of bits $A_2$, $A_1$ and $A_0$, together with an address enabling signal 1001, the address decoder 2 decodes the input address 101 to thereby select one of a plurality of output lines 301 to 308 including a plurality of address lines for the memory cell array 27 and a single line 301 called a test commanding line. The test commanding line 301 is connected to a control terminal of the test mode register 5 for providing a test commanding signal thereto.

The test mode register 5 is activated by an active level (for example, H-state) on the test commanding line 301 so as to receive and store an input data 401, which has been separately input from the data bus 4 and is composed of a plurality of bits including $D_2$, $D_1$ and $D_0$ for designating one of a plurality of test modes. Subsequently, the test mode register 5 selects one of the test mode selecting signal lines 601, 602 and 603 based on input data 401. In this example, it is determined that the test commanding line 301 is selected when the bits $A_2$, $A_1$ and $A_0$ of the input address 101 are such that $(A_2, A_1, A_0) = (1, 1, 1)$, considering that the memory cell array does not include a memory cell assigned to the address (1, 1, 1). In the following description, addresses or data are expressed such that the address or data (1, 1, 1) is simply expressed as "111", for example.

Figure 2:
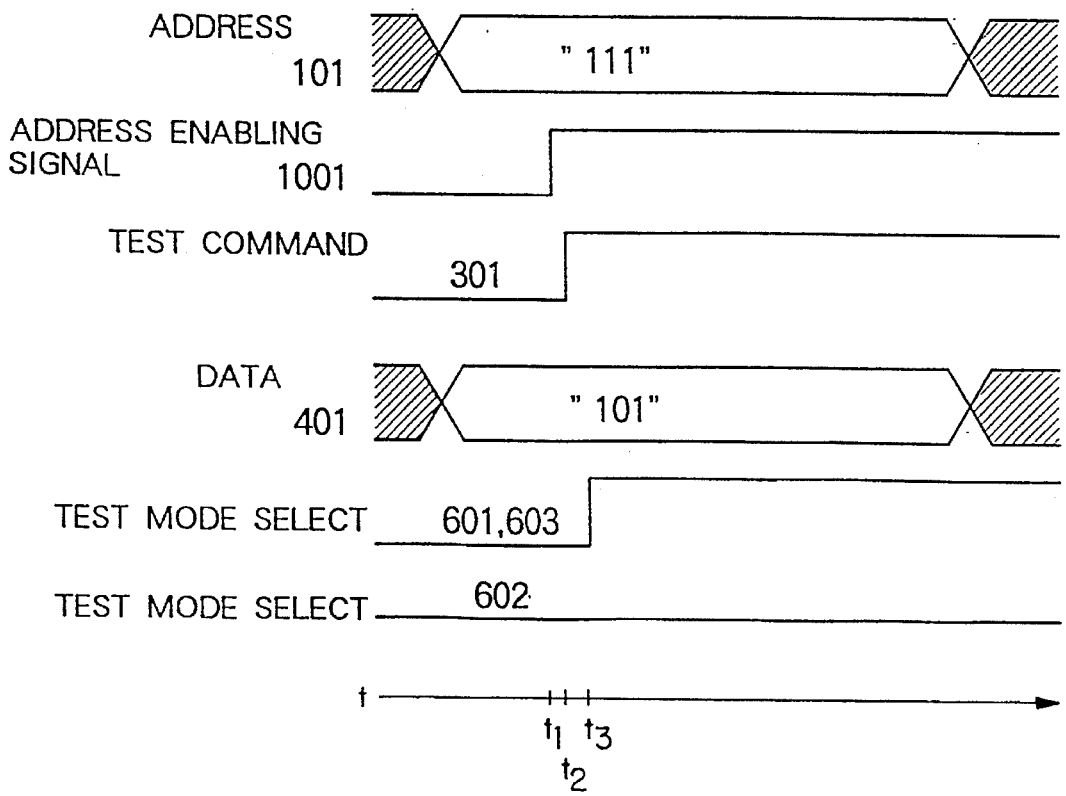
FIG. 2 is a timing diagram showing signals generated for a test operation mode in the memory device of FIG. 1.

FIG. 2 is a timing diagram showing signals in the semiconductor memory device of FIG. 1 during a test mode. When an address "111" for the input address 101 is supplied for commanding execution of a test, synchronously with the address enabling signal 1001, the address decoder 2 selects the test commanding line 301 so as to drive the line 301 up to an H-state. If a data "101" for the input data 401 are supplied simultaneously with the input address "111", the data "101" is stored in the test mode register 5. The signal transmitted through the three test mode selecting lines 601–603 corresponds to the respective bits of the data "101". That is, the line 601 is driven to an H-state, the line 602 to an L-state, and the line 603 to an H-state. The test mode selecting signals are input to the test performing section 28 so that a memory test is performed in the semiconductor memory device in accordance with the designated one of the test modes.

As described above, in the conventional memory device, the data designating one of plurality of test modes is input through the data bus in addition to an address signal. Hence, memory tester should provide all of the necessary data to the memory device, so that the test sequence of a memory tester is complicated.

Now, embodiments of the present invention will be described with reference to the drawings.

Figure 3:
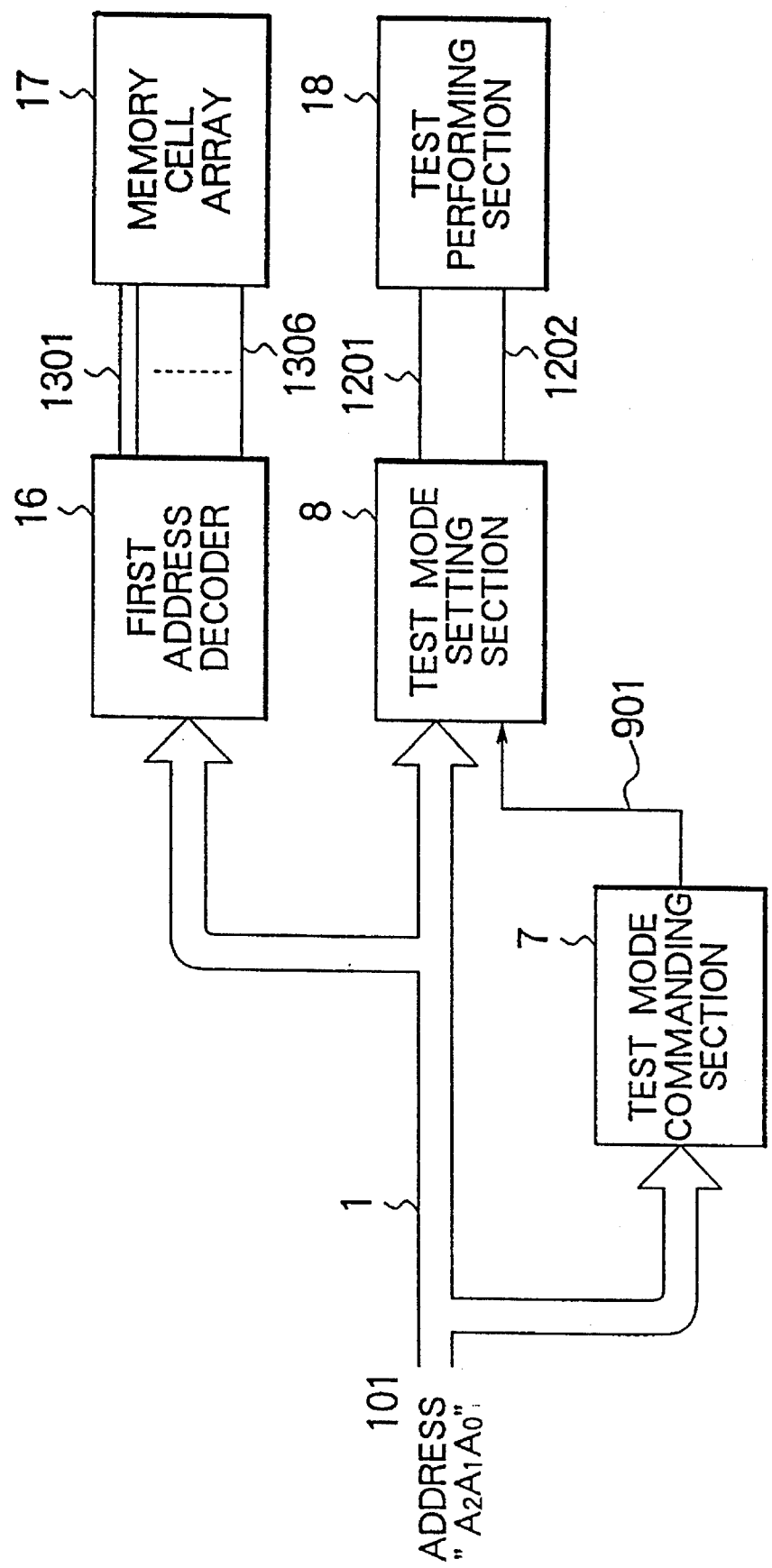
FIG. 3 is a block diagram of a semiconductor memory device in a simplified model according to a first embodiment of the present invention.

FIG. 3 is block diagram of a semiconductor memory device in a simplified model according to a first embodiment of the present invention. The semiconductor memory device comprises an address bus 1 for transmitting an address 101 for commanding execution of a test and for designating addresses of a memory cell array, a first address decoder 16 for decoding input address 101 for memory cells in the memory cell array 17, a test commanding section 7 for generating a test commanding signal responsive to any one of addresses corresponding to a plurality of test modes, and a second address decoder (test mode selecting section) 8 for selecting one of the test modes responsive to input address 101 designating the one of the test modes. The output from the first address decoder 16 is supplied to the memory cell array 17, while the output from the test mode selecting section 8 is supplied to a test performing section 18.

When an input address "$A_2A_1A_0$" corresponding to an address within an address space assigned to the memory cell array 17, i.e., an address in the first group is received via the address bus 1, one of output lines 1301–1306 is selected so that a unique memory cell in the memory cell array 17 is accessed. In this case, the semiconductor memory device operates in a normal operation mode.

When an address "$A_2A_1A_0$" designating an address included in the second group is received via the address bus a test commanding signal 901 is output from the test commanding section 7 in response to the receipt of the input address 101, so that the test mode selecting section 8 is activated. The test mode selecting section 8 latches the address "$A_2A_1A_0$" which has been input in the activated state thereof, and decodes the address so that a signal of H-level is output through one of a plurality of test mode selecting lines, for example, lines 1201 and 1202 as shown in the drawing. The signal of H-level on one of the test mode selecting lines 1201 and 1202 is maintained during the test operation mode due to a latching function of the test mode selecting section 8.

Figure 4:
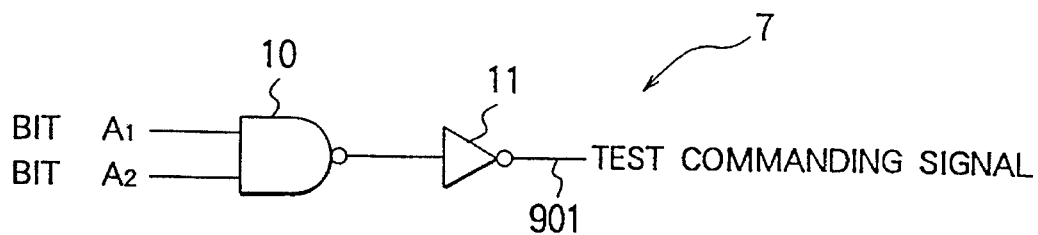
FIG. 4 is a circuit diagram of a test commanding section used in the memory device of FIG. 3.

FIG. 4 shows an example of the test commanding section 7 in the semiconductor memory device according to the first embodiment. In semiconductor memory devices according to the present embodiment and a second embodiment which will be described later, it is assumed that the address space for the memory cell array corresponds to the address "$A_2A_1A_0$"="000"–"101", and the addresses $A_2A_1A_0$= "110" and "111" are assigned to the second group.

The test commanding section 7 of FIG. 4 is implemented by a combination circuit composed of a NAND gate 10 having two input terminals receiving bits $A_1$ and $A_2$ of input address, and an inverter (INV) gate 11 for receiving the output from the NAND gate 10. When the NAND gate 10 is supplied with an address $A_2=1$ and $A_1=1$, the address are subjected to a logical operation in the test commanding section 7 so that signal "H" is output as the test commanding signal from the INV gate 11 through the line 901. In this embodiment, the memory device according to the present invention is implemented such that the test mode register in the conventional memory device of FIG. 1 is replaced by a second address decoder and the test commanding section.

Figure 5:
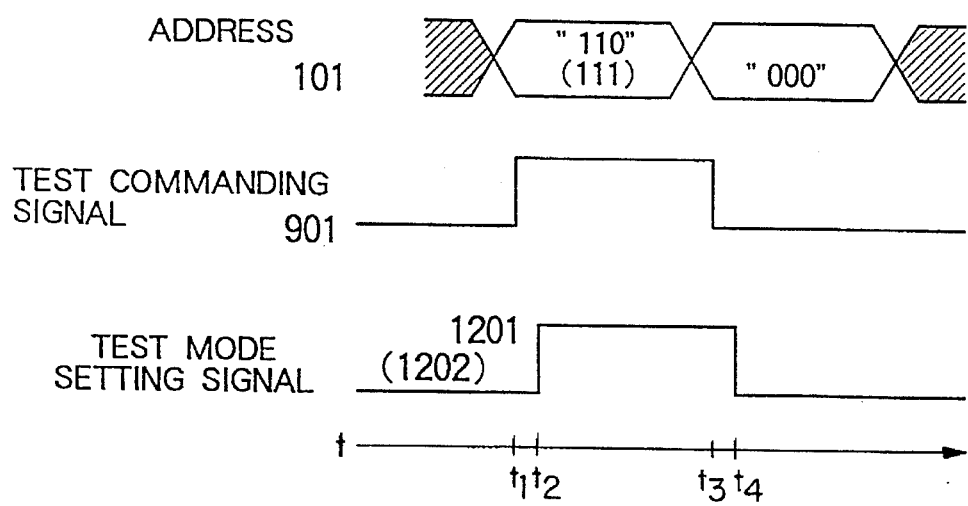
FIG. 5 is a timing diagram showing signals in the memory device of FIG. 3.

FIG. 5 is a timing diagram showing signals generated in the semiconductor memory device of FIG. 3 having the test commanding section 7 of FIG. 4. Address "110" for designating the first test mode among two test modes (or address "111" for designating the second test mode) are input synchronously with an address enabling signal. Then, the test commanding signal on the line 901 becomes an active level (H-state). The test mode selecting section 8 in FIG. 3 is activated by the active level on the test commanding line 901 so that a test mode selecting line 1201 (or 1202) is driven up to an H-state. The test performing section 18, after receiving the test mode selecting signal, executes a test inside the memory device in accordance with the first (or second) test mode.

order to stop the execution of the test, one of the addresses "000"–"101" assigned to the memory cell array 17, for example "000" as shown in FIG. 5, is input synchronously with the address enabling signal 101. Then, the test commanding signal on the line 901 becomes an inactive level (L-state), and both test mode selecting lines 1201 and 1202 become in an L-state. Hence, the test performing section 18 stops the test, and the memory device turns from the test operation mode to a normal operation mode.

The test mode selecting section 8 can be implemented by a combinational circuit, if the test performing section 18 has a function for latching the test mode selecting signal and a function for stopping a test when the output of the test commanding section is deactivated.

Figure 6:
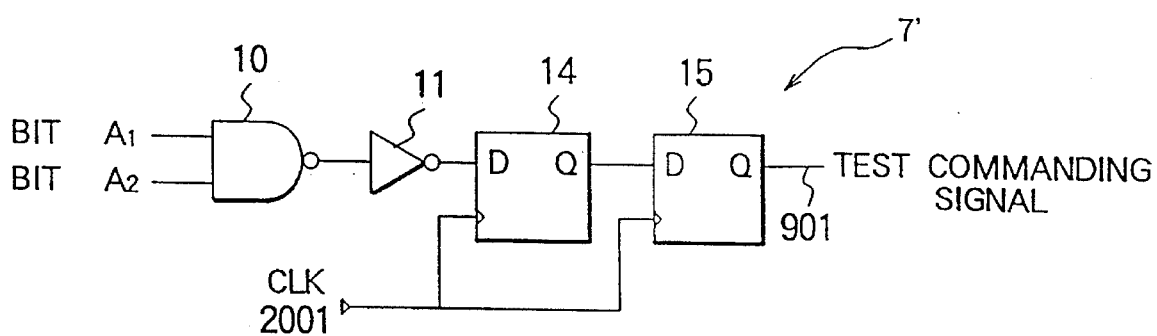
FIG. 6 is a circuit diagram of another test commanding section used in a memory device according to a second embodiment of the present invention.

FIG. 6 is a circuit diagram showing a second test commanding section 7' for replacing the first test commanding section 7 in the memory device of FIG. 3, according to the second embodiment of the present invention. In this embodiment, the test commanding section 7' is comprised of a sequential circuit including a NAND gate 10, an INV gate 11, and two D-type flip-flops 14 and 15 which are cascaded in sequence. The test commanding section 7' of FIG. 6 generates a test commanding signal 901 in response to bits $A_1$ and $A_2$ of an input address 101 supplied synchronously with a clock signal (CLK) 2001 FIG. 7 shows a timing diagram for the second embodiment.

When an address $A_2=1$ and $A_1=1$ are input, a signal "1" is supplied from the INV gate 11 to the first flip-flop 14. After the same address is again input synchronously with the next clock signal 2001, an active level "H" is output on the output line 901 from the second flip-flop 15. In this manner, when an address assigned to the second group, for example address "110", is input twice synchronously with the clock signal 2001, the test commanding signal line 901 becomes in an H-state so that the test mode selecting section 18 of FIG. 3 is activated.

Figure 7:
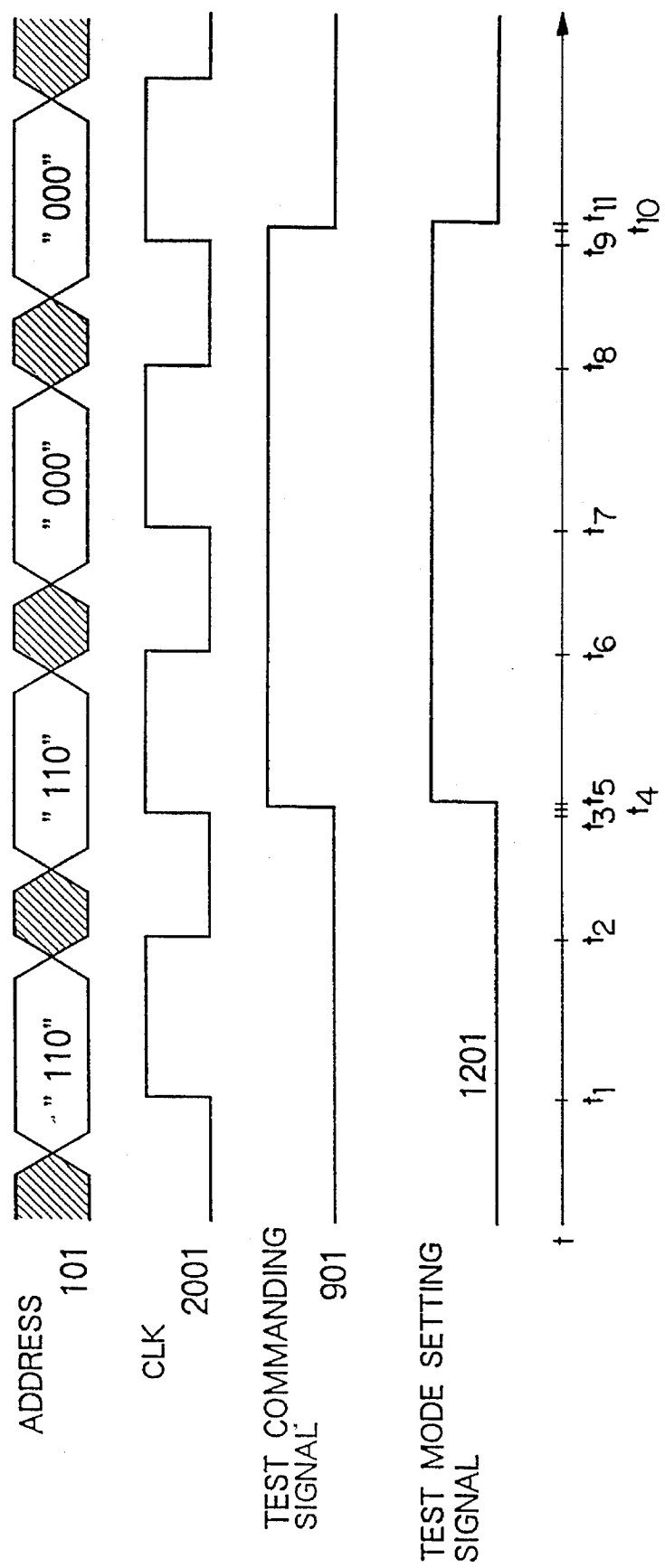
FIG. 7 is a timing diagram showing signals in the second embodiment.

Further, when an address assigned to the first group, for example address "000" as shown in FIG. 7, is successively input twice, the test commanding signal line 901 becomes in an L-state so that the test mode selecting section 8 in FIG. 3 is inactivated. As a result, both of the output lines 1201 and 1202 of the test mode selecting section 8 become in an L-state to thereby inform the test performing section 18 of the end of the test operation mode.

In the second embodiment, the test commanding signal is transmitted to the test mode selecting section 8 by successively inputting the same address twice. If a surge pulse of a high level enters through the address bus 1 to the test commanding section 7', the AND gate 10 and the INV gate 11 may output a wrong signal. However, the wrong signal is not output from the test commanding section 7' so long as the surge pulse does not remain high during two clock cycles. In this manner, switching between the test operation mode and the normal operation mode is performed with certainty, so that it is possible to avoid an error in the semiconductor memory device more effectively than the first embodiment.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A semiconductor memory device comprising a substrate, a plurality of memory cells arrayed on said substrate and each having an address included in a first address group, an address bus for supplying an address signal composed of a plurality of bits designated to one of addresses included in said first address group or one of addresses included in a second address group assigned to a plurality of test modes, a first address decoder, operatively connected between said address bus and said memory cells, for decoding addresses of said address signal included in said first address group for said memory cells, a second address decoder, operatively connected to said address bus, for decoding addresses of said address signal included in said second address group, and a test performing section, operatively connected to said second address decoder, for executing a memory test in one of said test modes based on the output of said second address decoder.

2. A semiconductor memory device comprising:

a substrate;

a plurality of memory cells arrayed on said substrate and each having an address included in a first address group;

an address bus composed of a plurality of bits for receiving an address signal designating one of addresses included in said first address group or one of addresses included in a second address group assigned to a plurality of test modes;

a first address decoder, operatively connected between said address bus and said memory cells, for decoding addresses included in said first address group for said memory cells;

a second address decoder, operatively connected to said address bus, for decoding addresses included in said second address group;

a test performing section, operatively connected to said second address decoder, for executing a memory test in one of said test modes based on the output of said second address decoder; and a test commanding section, operatively connected to said address bus and said second address decoder, for generating a test commanding signal responsive to any one of addresses included in said second address group, said test commanding signal activating said second address decoder for latching addresses included in said second address group.

3. A semiconductor memory device as defined in claim 2 wherein said test commanding section is composed of a combinational circuit.

4. A semiconductor memory device as defined in claim 2 wherein said test commanding section includes a sequential circuit.

5. A semiconductor memory device as defined in claim 4 wherein said sequential circuit includes two flip-flops cascaded in sequence.

6. A semiconductor memory device as defined in claim 1 wherein said memory device is used for storing image data for a display unit.

7. The semiconductor memory device as defined in claim 1, wherein said second address decoder is responsive to a logical high or low state of the bits in said second address group of said address signal to switch from a normal operating mode to said test modes.

8. The semiconductor memory device as defined in claim 1, wherein said memory test is performed only on those said memory cells which are addressable by addresses in said first address group.

* * * * *